(12) United States Patent
Smyth (10) Patent No.: US 8,819,523 B2
(45) Date of Patent: Aug. 26, 2014

(54) ADAPTIVE CONTROLLER FOR A CONFIGURABLE AUDIO CODING SYSTEM

(75) Inventor: Neil Smyth, Bangor (GB)

(73) Assignee: Cambridge Silicon Radio Limited, Cambridge (GB)

( * ) Notice: Subject to any disclaimer, the term of this patent is extended or adjusted under 35 U.S.C. 154(b) by 656 days.

(21) Appl. No.: 13/111,420

(22) Filed: May 19, 2011

(65) Prior Publication Data

US 2012/0296656 A1    Nov. 22, 2012

(51) Int. Cl.
*H03M 13/00* (2006.01)
*H03M 13/35* (2006.01)
*H03M 13/01* (2006.01)

(52) U.S. Cl.
CPC .............. *H03M 13/35* (2013.01); *H03M 13/01* (2013.01)
USPC .......................................... 714/774; 704/500

(58) Field of Classification Search
CPC ...... G10L 19/22; H03M 13/00; H03M 13/01; H03M 13/31; H03M 13/35
USPC ........................................... 711/500; 714/774
See application file for complete search history.

(56) References Cited

U.S. PATENT DOCUMENTS

| | | | | |
|---|---|---|---|---|
| 5,073,940 A | * | 12/1991 | Zinser et al. ................... | 704/226 |
| 5,247,579 A | * | 9/1993 | Hardwick et al. ............ | 704/230 |
| 5,819,215 A | * | 10/1998 | Dobson et al. ................ | 704/230 |
| 6,405,338 B1 | * | 6/2002 | Sinha et al. .................... | 714/752 |
| 7,613,606 B2 | * | 11/2009 | Makinen ........................ | 704/221 |
| 2005/0055203 A1 | * | 3/2005 | Makinen et al. .............. | 704/229 |
| 2008/0043643 A1 | * | 2/2008 | Thielman et al. ............. | 370/260 |
| 2009/0006104 A1 | * | 1/2009 | Sung et al. ..................... | 704/500 |
| 2010/0324915 A1 | * | 12/2010 | Seo et al. ....................... | 704/500 |

* cited by examiner

*Primary Examiner* — John Trimmings
(74) *Attorney, Agent, or Firm* — Withrow & Terranova, P.L.L.C.

(57) ABSTRACT

An adaptive controller for a configurable audio coding system comprising a fuzzy logic controller modified to use reinforcement learning to create an intelligent control system. With no knowledge of the external system into which it is placed the audio coding system, under the control of the adaptive controller, is capable of adapting its coding configuration to achieve user set performance goals.

17 Claims, 5 Drawing Sheets

ADAPTIVE CONTROLLER FOR A CONFIGURABLE AUDIO CODING SYSTEM

FIELD OF THE INVENTION

The present invention relates to audio coding systems. The invention relates particularly to the control of a multi-dimensional audio coding apparatus and method.

BACKGROUND TO THE INVENTION

Some audio coding apparatus may be configured to achieve different levels of performance across one or more performance measures, e.g. relating to complexity, battery life, latency, bit rate and quality. This may be achieved by selecting from a range of audio coding tools each having a respective effect on performance in respect of one or more performance measures. Such apparatus may be referred to as multi-dimensional audio coding apparatus, and the corresponding algorithms may be referred to as multi-dimensional audio coding algorithms.

During use, the configuration of the coding apparatus may have to be modified over time to achieve varying performance goals. This configuration can be complex given the high number of possible coding tool combinations and their varying impact on the coding apparatus. The coding apparatus may also behave differently depending upon the system and hardware platform in which it is incorporated during use and/or the task it is performing at any given moment. This results in a coding algorithm that is difficult to characterize and control.

It would be desirable to provide an adaptive control mechanism to optimally select an appropriate set of audio coding tools at any given instant using system performance measures.

SUMMARY OF THE INVENTION

A first aspect of the invention provides a controller for a configurable audio coding system, the controller being arranged to receive from said audio coding system an input comprising at least one performance parameter value indicating at least one performance characteristic of the audio coding system,
wherein said controller is configured to maintain a plurality of states, each state corresponding to at least one of said respective performance parameter values and being associated with at least one action for configuring said audio coding system, and wherein said controller comprises
  a reward calculator configured to calculate a reward parameter based on said at least one parameter value and at least one corresponding performance goal,
  a state-action evaluator configured to maintain a respective state-action evaluation value for said at least one action associated with each of said states, and to adjust said respective state-action evaluation value depending on a respective value of said reward parameter,
  an action selector configured to select, for a respective state, at least one of said at least one actions associated with said respective state based on an evaluation of the respective state-action evaluation values of said at least one actions associated with the respective state,
and wherein said controller is configured to produce an output comprising data identifying said selected at least one action.

The controller typically includes a state quantizer configured to determine, from said at least one performance parameter value, a next one of said states to be taken by said controller.

Typically, said at least one performance parameter can take a range of values, said controller further including a state quantizer arranged to define a plurality of bands for said values, each band corresponding to a respective one of said states, and wherein said state quantizer is further arranged to determine to which of said bands said at least one performance parameter of said input belongs to.

The state quantizer may be configured to determine that the respective state corresponding to said determined band is a next state to be taken by said controller.

Preferably, said state-action evaluator is configured adjust the respective state-action evaluation values for a respective state depending on a value of said reward parameter calculated using the at least one performance parameter value received in response to configuration of said audio coding system by said selected at least one action for said respective state.

Said state-action evaluator may be configured adjust the respective state-action evaluation values for a respective state depending on the corresponding state-action evaluation values for a next state to be taken by said controller.

In preferred embodiments, said controller is configured to implement a machine-learning algorithm for maintaining said state-action evaluation values, especially a reinforcement machine learning algorithm, for example a SARSA algorithm.

Said at least one performance characteristic may include any one or more of computational complexity, computational latency, bit rate error, bit burst error rate or audio quality.

Said at least one action typically includes selection of at least one coding method or type of coding method for use by said audio coding system, and/or selection of a configuration of at least one coding method for use by said audio coding system.

In preferred embodiments said action selector comprises a fuzzy logic controller. The fuzzy logic controller preferably uses said respective state-action evaluation values of said at least one actions associated with the respective state to construct consequent fuzzy membership functions.

Said at least one of said respective performance parameter values and said least one action may be associated with a respective configurable aspect of the audio coding system. Said configurable aspect typically comprises a configurable coding tool or coding method.

A second aspect of the invention provides a method of controlling a configurable audio coding system, the method comprising: receiving from said audio coding system an input comprising at least one performance parameter value indicating at least one performance characteristic of the audio coding system; maintaining a plurality of states, each state corresponding to at least one of said respective performance parameter values and being associated with at least one action for configuring said audio coding system; calculating a reward parameter based on said at least one parameter value and at least one corresponding performance goal; maintaining a respective state-action evaluation value for said at least one action associated with each of said states; adjusting said respective state-action evaluation value depending on a respective value of said reward parameter; selecting, for a respective state, at least one of said at least one actions associated with said respective state based on an evaluation of the respective state-action evaluation values of said at least one actions associated with the respective state; and producing an output comprising data identifying said selected at least one action.

A third aspect of the invention provides a configurable audio coding system comprising the controller of the first aspect of the invention.

From another aspect, the invention provides a configurable audio encoder comprising the adaptive controller of the first aspect of the invention.

A further aspect of the invention provides a computer program product comprising computer usable code for performing, when running on a computer, the method of the second aspect of the invention.

In preferred embodiments, the audio coding apparatus is arranged to adapt one or more of its audio coding functions and/or one or more characteristics of the audio coding algorithm that it implements, to achieve an optimal level of error control, and/or other performance measure(s), for a particular environment or application. In the case of error control, this may be achieved by providing the encoder with parameters describing the error characteristics of the transmission channel. In addition to transmission error characteristics, the preferred multidimensional audio coding apparatus is capable of cognitively adapting to achieve performance goals such as computational complexity, algorithmic latency and bit rate.

The cognitive ability of preferred multidimensional-adaptive audio coding apparatus embodying the invention provides the ability to adapt the operation of the apparatus to one or more performance measures, e.g. error measures such as detected bit and/or packet errors. Whilst other conventional audio coding algorithms could utilize error control tools, these schemes typically have coarse-grained control and predetermined error control characteristics that cannot be easily altered or shaped.

In preferred embodiments, the multidimensional-adaptive audio coding apparatus is configured to modify error control tools in a dynamic manner, e.g. according to external measures of channel noise and other system parameters. However, due to the multidimensional nature of the adaptation, such an apparatus should also be configured to know how the choice of error control strategy affects other performance goals, such as coded bit-rate, algorithmic latency, perceptual audio quality and computational complexity.

Further advantageous aspects of the invention will become apparent to those ordinarily skilled in the art upon review of the following description of a preferred embodiment and with reference to the accompanying drawings.

BRIEF DESCRIPTION OF THE DRAWINGS

An embodiment of the invention is now described by way of example and with reference to the accompanying drawings in which.

DETAILED DESCRIPTION

Figure 1:
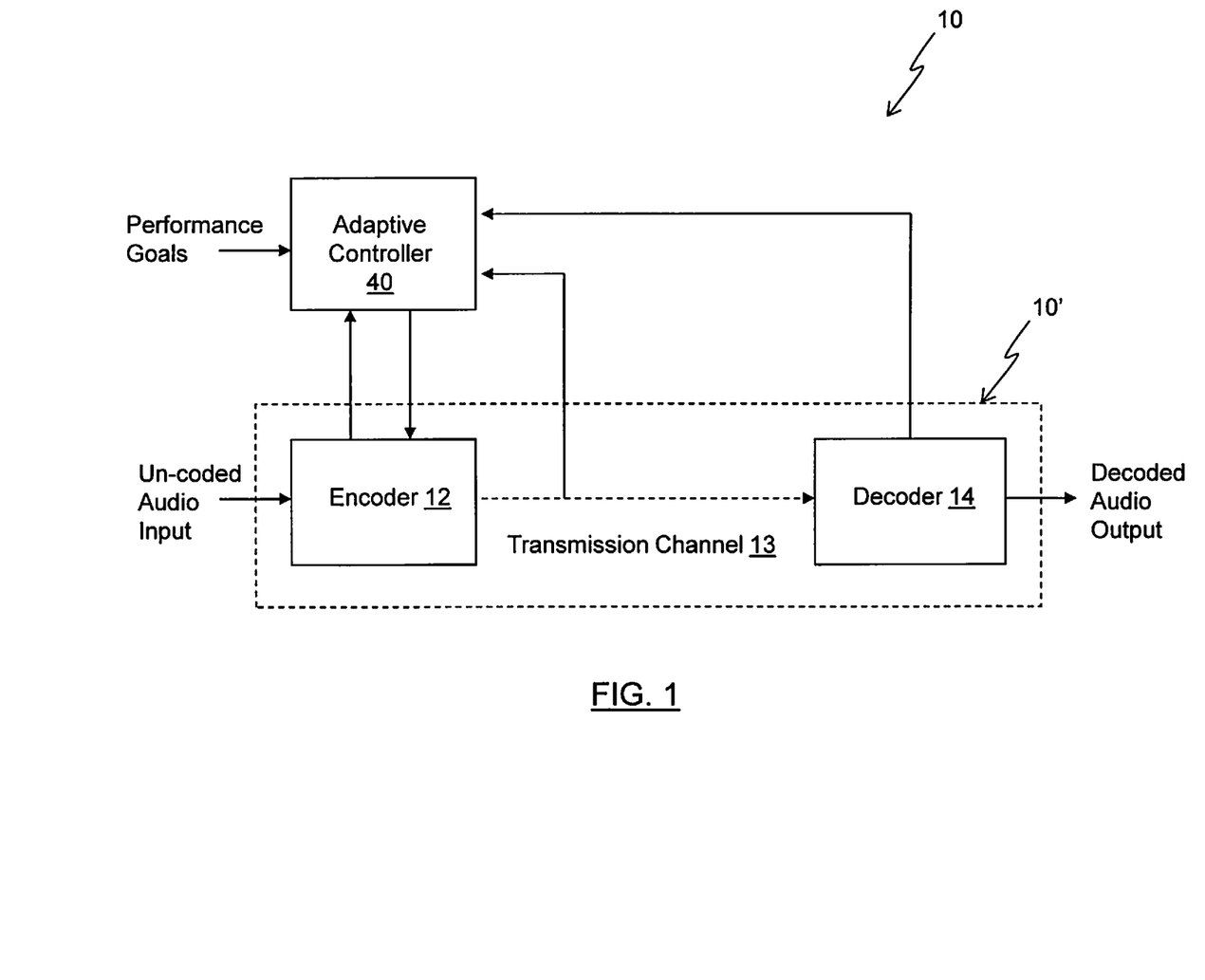
FIG. 1 is a schematic diagram illustrating an audio coding system comprising an audio encoder and an audio decoder.

FIG. 1 of the drawings provides a schematic diagram of an audio coding system 10, or audio transmission system, comprising an audio encoder 12 and an audio decoder 14 (which may collectively be referred to as a codec and which are identified in FIG. 1 as 10') capable of communicating with each other via a communications link 13, which may be wired or wireless. In use, the encoder 12 receives an input signal comprising a stream of audio data samples. The data samples typically comprise pulse code modulated (PCM) data samples, but may alternatively comprise any other suitable digital, or digitized, data samples. The encoder 12 applies one or more coding techniques, which typically result in compression of the input signal, to produce an output signal comprising a compressed data stream.

The compressed data stream provides the input signal for the decoder 14. The decoder 14 processes the incoming data stream to produce a decoded output signal comprising a stream of audio samples. The processing performed by the decoder 14 includes reversing any reversible coding or compression performed by the encoder 12.

Figure 2:
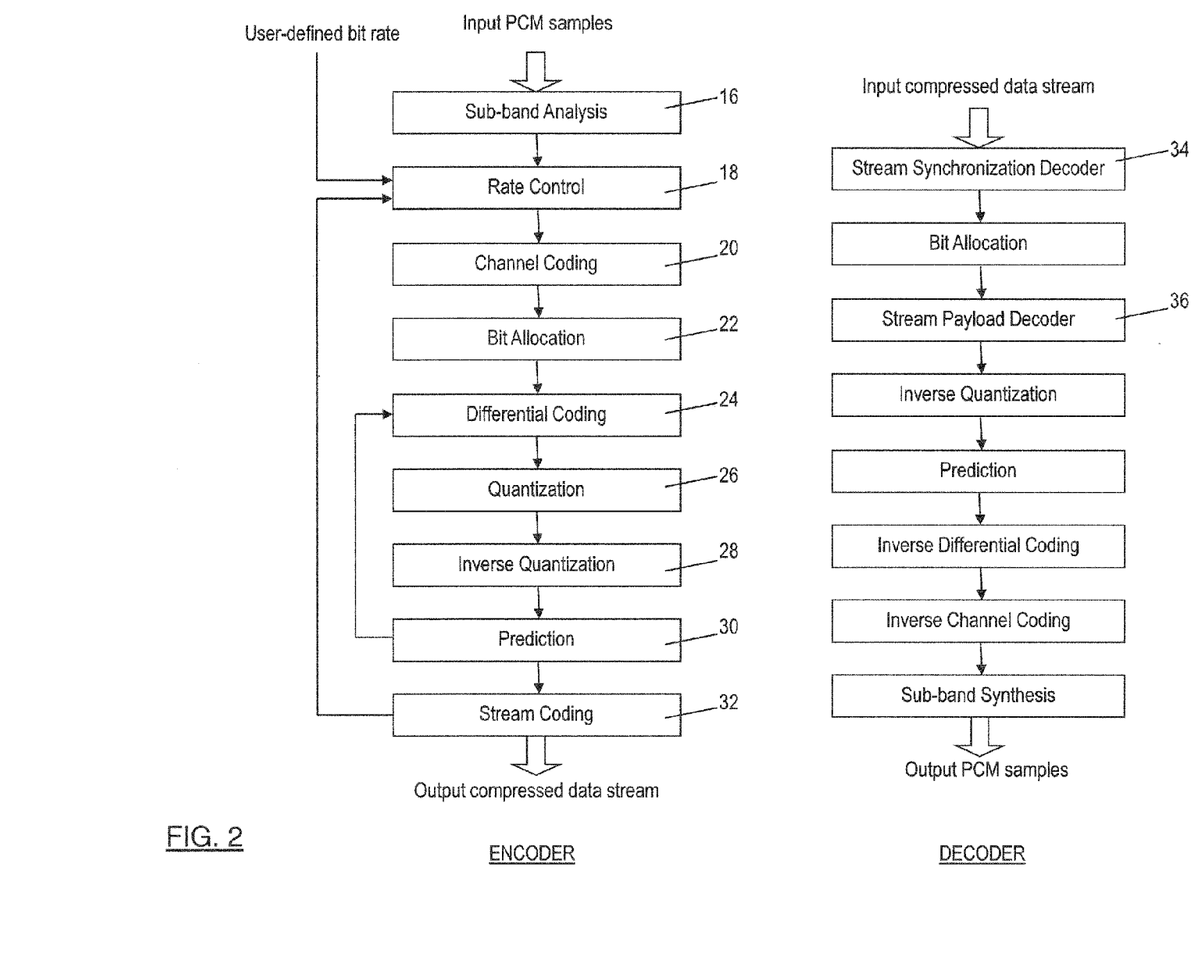
FIG. 2 is a schematic diagram illustrating a more detailed example of an encoder and a decoder.

In FIG. 2, more detailed examples of a suitable encoder 12 and decoder 14 are shown, comprising a plurality of functional blocks that represent respective stages in the audio encoding and decoding methods, or algorithms, performed respectively by the encoder 12 and decoder 14, and which may be implemented in hardware, by computer program(s), or by any combination of hardware and computer program(s), as is convenient.

By way of example, in the illustrated encoder 12, a subband analysis block 16 decomposes the input data samples into sub-bands (spectral, or frequency, decomposition). A rate controller 18 receives a user defined bit rate and an indication of achieved bit rate as inputs and determines bit allocation on a frame by frame basis. A channel coder 20 exploits coding redundancies between channels and sub-bands. A bit allocator 22 allocates bits according to perceptual importance of the coded sub-bands. A differential coder 24 receives an indication of predicted sub-band samples and uses a residual signal to reduce quantization noise. A quantizer 26 quantizes coded sub-band samples according to their perceptual importance. An inverse quantizer 28 performs inverse quantization which is used for predictive purposes and quantization noise analysis. A predictor 30 predicts sub-band samples by exploiting spatial coding redundancies within each sub-band. A stream coder 32 codes, e.g. using entropy encoding, the quantized sub-band samples into a data stream, preferably using lossless coding to reduce the bit rate.

The decoder 14 includes blocks for performing the inverse of the coding performed by the encoder 12. In FIG. 1, the decoder further includes a stream synchronization decoder 34 for synchronizing to the start of audio frames and decoding frame headers to configure the multi-dimensional algorithm being implemented by the system 10. A stream payload decoder 36 recovers the payload data after synchronization. One or more of the blocks in the encoder and/or decoder may be configured to perform error correction coding.

In preferred embodiments, the system 10 and in particular the encoder 12 is configurable to use any selected one (or more) of a respective plurality of methods in respect of one or more aspects of its operation. For example, a plurality of different coding methods (or coding tools) may be available to the encoder 12 (and/or decoder 14 as applicable) for performing at least one of the tasks of data compression, predictive coding, quantization, subbanding, channel coding, error correction coding, entropy coding and/or any other coding task to be performed. Depending on which method is selected, the performance of the system 10 may differ with respect to performance measures such as latency, bit rate, complexity and quality attributes. Advantageously, it is possible to dynamically modify the choice of coding tools at any given time, but the selected coding tools must be communicated with the decoder.

One option for a user wishing to utilize a multidimensional audio coding algorithm is to determine the optimal configuration of that algorithm given a wide range of coding tools and operating environments. This can be a significant challenge, particularly in a system where complex external factors affect the performance of the audio compression system. Examples of external environmental changes include: a microprocessor in an embedded device running other tasks can experience processor, cache and memory performance variations over time that effect the efficiency of coding tools; the multidimensional audio coding algorithm can operate on different processor architectures, resulting in varying performance of coding tools based on hardware capabilities; a transmission channel can periodically be subjected to noise due to an adverse environment; the system enters a low power state to prolong the battery life.

In order to dynamically configure the system 10, an adaptive controller 40 is provided. The controller 40 receives an input, e.g. set by a user or an external system (not shown), comprising data indicating one or more performance goals. The controller 40 also receives one or more other inputs comprising data value(s) for one or more performance parameters of the system 10, for example parameter(s) of the performance of the encoder 12, the decoder 14 and/or the transmission channel 13. In FIG. 1, the controller 40 receives an input from the encoder 12 comprising one or more parameter values relating to the encoder's performance, e.g. a complexity parameter (which typically provides an indication of how much computer processing power is required by the encoder 12), a latency parameter (which is an indication of the delay introduced into the streamed audio data by the system 10), and/or an audio quality parameter. From the transmission channel 13, the controller 40 receives an input comprising data indicative of available bandwidth and/or other channel statistics. Examples of channel statistics include (a) the packet loss rate, (b) bit error rate (BER), (c) a measure of the BER distribution, (d) minimum/maximum transmission packet size, (e) optimal transmission packet size for maximum throughput and/or latency. From the decoder 14, the controller receives an input comprising data indicative of decoder complexity. If the decoder 14 is of the type that can provide data to the encoder 12 across a bidirectional communications channel it could provide useful performance measures to the controller 40 such as (a) complexity, (b) the percentage of the audio stream that has been discarded due to error, (c) a quantitative measure of the decoded audio quality, (d) metrics describing the types of errors encountered when decoding the audio stream. Typically, the channel statistics include the channel error characteristics described above, allowing general decisions about the data stream to be determined, such as frame sizes, suitable latencies and whether error correction coding is required. The decoder 14 may provide error performance data related to the coded audio stream that allows the encoding system to modify the stream structure to specifically target problems, e.g. the relative number of corrupted frame headers is high so the encoder decides to use error correction coding on the headers.

The adaptive controller 40 is configured to evaluate the received performance measurement data against the received performance goals data in order to determine how the system 10, and in particular the encoder 12, should be configured. If appropriate, the controller 40 communicates configuration data to the system 10, and in particular to the encoder 12, in response to which the encoder 12, and/or any other appropriate component of the system 10, adapts its configuration in accordance with the configuration data. In particular, the controller 40 may cause the encoder 12 (and/or any other appropriate component of the system 10) to adopt one or more of the available coding tools, or methods, selected by the controller 40 in respect of one or more aspects of the encoder's, or system's, operation, and/or to adjust the operation of one or more coding methods already in use. Hence, the performance of the system 10 changes in accordance with the configurations changes under the control of the controller 40 seeking to meet the performance goals.

Thus, in a dynamically-changing system, the coding tool(s) appropriate for a particular performance goal are selected by the controller 40 in real-time using an adaptive control method in response to system performance data.

Advantageously, the adaptive controller 40 is configured to operate independently of the characteristics of the encoder 12, decoder 14 or transmission channel 13, i.e. the controller 40 is able to interact with the rest of the system 10 as a "black box" in that it receives performance related output signals from the other components of the system 10 provides configuration input(s) to the other components of system 10 but does not need to know what the system comprises, how it is configured, how it works or how configuration changes will affect its operation. This removes the need to support accurate mathematical modeling of the system 10.

Hence, the adaptive controller 40, given no prior knowledge of the system in which it is operating or the capabilities of the audio coding tools available to the audio coding algorithm implemented by the system, is capable of learning which coding tools provide optimal performance in various circumstances (as for example may be determined by the performance goal(s)). To this end, the adaptive controller 40 is configured to implement a machine learning algorithm, advantageously a machine learning algorithm that can adapt to an unknown operating environment. The machine learning algorithm can optionally be initialized with prior knowledge of the system 10 to reduce initialization delay, e.g. provided with one or more sets of configuration data with which the system 10 may be initialised. As a result, the system 10 is able to dynamically adapt to demands such as reducing the audio coding complexity when a device employing the system 10 enters a low power state, or reducing bit rate to meet fluctuating transmission channel demands. Advantageously, the adaptive system 10 can be implemented within any external system, device or processor architecture and does not require tuning to achieve optimal performance. This leads to additional benefits in reduced engineering time when implementing the multidimensional-adaptive audio coding algorithm.

As is described in more detail hereinafter, preferred embodiments of the invention involve the application of machine learning to an audio coding system such that the performance of the system can be varied in terms of one or more of: the encoder complexity, decoder complexity, algorithmic latency and error resilience, whilst also pursuing the goal of achieving optimal audio quality for a given bit rate.

In preferred embodiments, the adaptive controller 40 is configured to use a reinforcement learning technique, for example SARSA (State Action Reward State Action) or Q-learning, for selecting and configuring the components of the audio codec 10'. A SARSA, or similar, agent operates by taking a given action in a given state. The states are learned during use through determination of a respective optimal solution to a respective action value function. An advantage of a SARSA, or similar, agent is its ability to take actions without knowledge of the system it is controlling.

To implement the controller 40 as a SARSA system (or other machine learning system), the range of states that the controller 40 can take, or select, is divided into a finite set of state, where each state represents a value, or range of values, that one or more respective performance parameters (e.g. complexity, latency, bit rate, quality) of the system 10 can take. In preferred embodiments, the controller 40 is configured to control one configurable aspect of the codec 10's operation, e.g. a respective coding tool or coding method, such as entropy coding, quantization, subbanding, error resilience or other compression coding tool/method. The controller 40 receives from the codec 10' data representing one or more performance parameters that are relevant to the configurable aspect that is under the controller's 40 control. The controller 40 is able to select any one or more of a plurality of actions for implementation by the codec 10' which change the configuration of the codec 10' in respect of the aspect under control, e.g. by selecting one type of coding tool/method over another, and/or by adjusting one or more operating parameters of a coding tool/method. For example, the controller 40 may control one coding tool (e.g. entropy coding) and can perform a number of actions (e.g. which type of entropy coding to use).

Typically, each performance parameter can take a wide range of values (which may be continuous rather than discrete) and so the overall range is preferably divided into a set of quantized levels, such that each possible value falls into one or other of the quantized levels. Where the performance parameter can take a smaller number of discrete values, each discrete value may correspond to a respective state. The state-space supported by the controller 40 can be quantized into one or a plurality parts, for example where each part corresponds to a respective relevant performance parameter (e.g. it may be desired only to divide the state-space into a small range of encoder complexities, or a larger range of complexities, latencies and packet loss rates). When generating the state-space, as the number of performance parameters used increases, and the granularity of the quantization becomes finer, the size of the state-space increases (requiring significantly more memory) and takes longer for the controller 40 to learn, but once it is initialized it can react faster and more appropriately to changes. Hence, the size of the resulting state-space is determined by the number of input variables (e.g. complexity, latency or other performance parameters) provided by the system 10', and the number of quantized levels provided for each variable.

Each state is associated with a plurality of actions (e.g. selection of a coding tool, type of coding tool or modification of a coding tool) that could be selected by the controller 40, where each action may result in the state being modified. A respective state-action value, in this case known as a Q value, for each possible state and action is maintained by the controller 40 to allow it to choose between actions. The controller 40 maintains a state-action value for each element of the state-space, where each element comprises a respective state in association with a respective one of its actions (the state-space being composed of a plurality of states and a plurality of actions for each state). For example, if the state-space for the controller 40 comprises 3 states of encoder complexity and 4 actions, the controller 40 maintains 12 state-action values. Given the encoder complexity (e.g. by way of initialization or through the learning process), the controller 40 can determine which of the 3 states it is in. It can then evaluate the relevant performance parameters using a reward function to modify the appropriate state-action values for the operating state. Nest, the controller 40 determines the next action to take according to which of the 4 state-action values is determined to be optimal. The goal of the machine-learning algorithm implemented by the controller 40 is to learn which action is optimal for each state by finding which state-action value (Q value) is largest (or smallest depending on how the calculation is performed).

The state-space does not have to include states in respect of all of the relevant performance parameters, but the state-action evaluation typically does assess all relevant performance parameters. Dividing multiple parameters into a quantized state is conceptually the same as creating a multidimensional state, e.g. complexity can be HIGH or LOW, latency can be HIGH or LOW, therefore the quantized state is of size STATE[2][2] and all possible quantized states are covered with 4 elements.

The adaptation of the state-action values (Q values) may be performed using equation (1) shown below. For any given state s and action a, the Q value is updated according to a learning rate $\alpha$ and a discount factor $\beta$. Parameter t is an index, typically representing time. The learning rate $\alpha$ determines the rate at which the Q state-action is adapted to the reaction of the system 10 to changes implemented by the controller 40. The discount factor $\beta$ determines the impact of future state-actions that will be taken. Over time the discount factor typically decays in order to make the learning algorithm less opportunistic and more stable. It will be understood that the invention is not limited to SARSA and in alternative embodiments other state-action values may be maintained using other formulae.

$$Q(s_t,a_t)=Q(s_t,a_t)+\alpha[r_{t+1}+\beta Q(s_{t+1},a_t)-Q(s_t,a_t)] \quad (1)$$

Equation (1) relates to the machine learning method SARSA (or "SARSA" Q-learning), which is closely related to and derived from Q-learning. Other machine learning methods, e.g. other Q-learning methods such as "Watkins" Q-Learning, may alternatively be used.

Hence, in the preferred embodiment, the optimal solution to the action-value function is found using the State-Action-Reward-State-Action (SARSA) algorithm of equation (1). SARSA updates the state action Q value using an error signal that is modified according to the learning rate $\alpha$.

The reward of the action that has been taken is represented by r(t+1) and is calculated by a reward function. This reward contributes to the modification of the Q state-action values to effect a learning process, whereby the action taken is determined by the state-action with the highest value. The learning rate is determined by the value of $\alpha$. The discount factor $0<\beta<1$ determines the impact of future state-actions that will be taken. As the discount factor tends toward 1 the learning algorithm becomes more opportunistic. The discount factor may decay over time to promote steady-state operation. The reward function can assess one or a plurality of performance parameters when calculating the reward value, the assessment typically involving comparison of the performance parameter(s) against the relevant performance goal(s), The adaptive controller 40 may comprise one or more intelligent agents (e.g. a respective intelligent agent for each coding tool/method to be controlled), wherein each intelligent agent comprises a machine-learning agent as described above. The, or each, intelligent agent is configured to recognize the relevant performance goal(s) and to understand that it can choose to perform one or more of a plurality of actions in order to achieve the goal(s). The intelligent agent monitors the environment that it operates within (as for example is determined from the input(s) received from the encoder 12, transmission channel 13 and/or decoder 14—whose values determine the state of the machine-learning agent) and the effect of actions that it exerts on that environment (as for example is determined from the subsequent input(s) received from the encoder 12, transmission channel 13 and/or decoder 14). The intelligent agent acts as an autonomous entity that continually adapts to the varying environment and goals.

Figure 4:
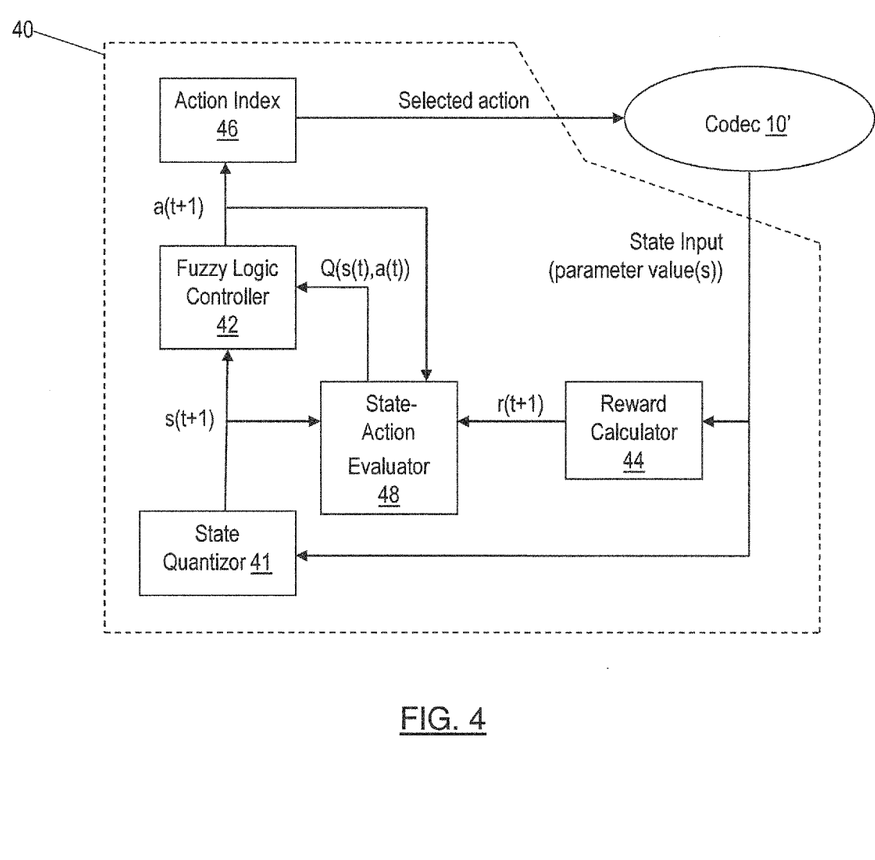
FIG. 4 is a schematic diagram illustrating an adaptive control apparatus embodying one aspect of the invention.

Typically, the adaptive controller 40 includes a logic controller for selecting actions. Preferably, the logic controller comprises a fuzzy logic controller 42 (FIG. 4). Fuzzy logic is a multi-valued logic utilized in soft computing to represent variables that contain a range of logic states, thereby allowing concepts to be represented as partially true. Rather than attempting to model the system mathematically, the fuzzy logic controller 42 implements a conditional rule-based approach, for example comprising rules of the form IF X AND Y THEN Z, where X and Y are antecedents each representing a possible system state (e.g. a variable such as a performance measure taking a particular value), and Z is a consequent representing an action to be taken. Such rules rely upon experience rather than technical understanding of a system to determine actions that must be taken.

Each input variable of the fuzzy logic controller is mapped to a set of membership functions known as fuzzy sets. The membership functions may conveniently be represented as triangles or other two dimensional shapes and the fuzzy logic outcome may be controlled through manipulation of the geometry of each triangle or other shape. The parameters that can be manipulated include the height, width, centre position and gradient of each membership function.

The fuzzy logic controller 42 implements an input stage, a processing stage, and an output stage. During the input stage, the fuzzy logic controller 42 maps the or each input(s) to one or more appropriate membership functions. In the processing stage, the controller 42 applies the or each appropriate rule and generates a result for each rule, after which the results are combined using any suitable combination method to produce a combined result. At the output stage, the controller 42 maps the combined result to a consequent membership function that determines the output variable. The controller 42 converts the combined result into a specific "crisp" output value using a process known as defuzzification.

Figure 3:
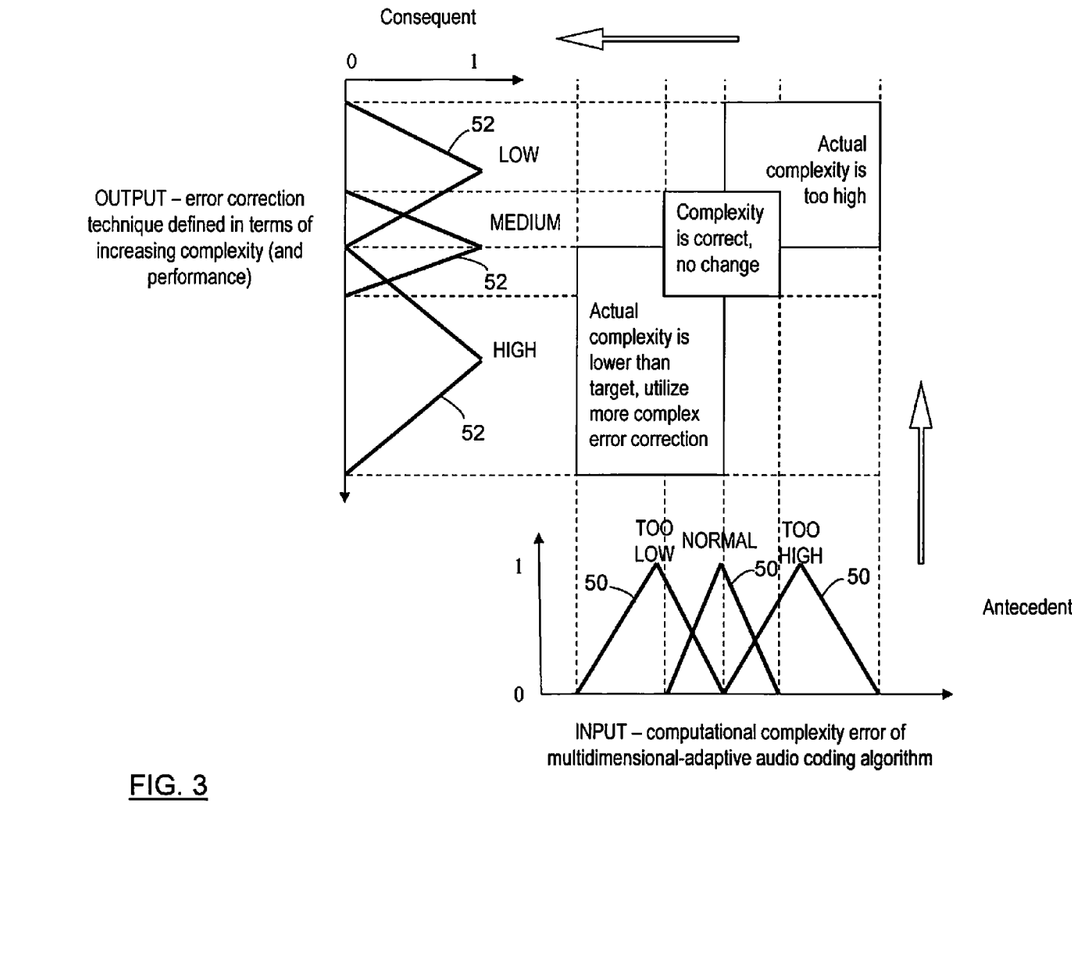
FIG. 3 is a graphical illustration of how a three rule fuzzy logic controller may be used to select the appropriate error correction tool based upon the complexity of a multidimensional adaptive audio coding algorithm.

An example of the operation of a fuzzy logic controller is shown in FIG. 3 where the input variable is the computational complexity error value received from the system 10, and is mapped to a fuzzy set having three membership functions represented by three antecedent triangular membership functions 50. The three functions 50 each describe a performance characteristic, in this case computational complexity, of the audio coding algorithm being implemented by the system 10. In this example the functions describe the complexity as being TOO LOW, NORMAL or TOO HIGH respectively. The fuzzy antecedent outputs for each possible output state are determined from the scaled sum of the membership functions for any given input. The fuzzy consequent membership functions 52 are used to combine the fuzzy antecedent state results into a single result. This process can be performed by a fuzzy centroid algorithm, which can determine the centroid position of the combined area of fuzzy membership functions. Once a single conclusion has been reached the output value must undergo defuzzification to obtain a crisp variable. This variable forms the output of the fuzzy logic controller 42 that is used to control the system 10. In this example, the crisp output determines the use of one of three possible error correction coding schemes, each corresponding to a different level of complexity. Hence, FIG. 3 shows how a three rule fuzzy logic controller can be used to select the appropriate error correction tool based upon the complexity of the multidimensional adaptive audio coding algorithm.

FIG. 4 shows a preferred embodiment of the adaptive controller 40 wherein the controller 40 is configured to implement a machine learning algorithm, SARSA in this example, and includes an action selector 42 which preferably comprises a fuzzy logic controller. In alternative embodiments, a binary logic controller may be used instead of a fuzzy logic controller. When combined, a logic controller, especially a fuzzy logic controller, and a machine learning algorithm, especially a SARSA algorithm, can be used to provide the intelligent agent (which may be referred to as a fuzzy agent in the preferred embodiment).

In FIG. 4 the controller 40 communicates with the audio codec 10', treating it as an unknown system. The controller 40 receives an input from the codec 10' comprising one or more parameter value for one or more performance parameters (e.g. latency, complexity, bit rate, BER, bit burst error rate etc.) being monitored by the controller 40. The parameter value input may be regarded as a state input, since each parameter value falls within one or other of the quantized levels corresponding to a state supported by the controller 40. FIG. 4 shows the architecture for a single intelligent agent which, in the preferred embodiment, is configured to control a single configurable aspect (e.g. coding tool) of the codec 10'. In alternative embodiments, the controller 40 may include more than one intelligent agent, each of which may have the same or similar architecture to that shown in FIG. 4, and each configured to control a respective configurable aspect of the codec 10'.

As described in relation to FIG. 1, the controller 40 also receives one or more performance goals relating to the relevant performance parameter(s). The controller 40 can select one or more of a plurality of actions in response to the parameter value input(s), the or each action corresponding to a change in configuration of the codec 10', e.g. an action may corresponding to the selection of a coding tool or method, or the setting of a parameter relating to a coding tool or method. The controller 40 communicates the selected action(s) to the codec 10', in response to which the codec 10' adjusts its configuration accordingly, e.g. changes one coding tool or type of tool for another, and/or adjusts the operation of an existing coding tool. The controller 40 determines which actions should be taken to achieve the required performance goals as is now described in more detail.

The controller 40 includes a reward calculator 44. The reward calculator 44 determines a value for a reward parameter, or variable, $r(t+1)$, from the performance parameter value(s) received from the codec 10'. The reward value can be calculated in any desired manner, but preferably involves evaluation of the performance parameter value(s) against one or more of the performance goals. The reward value calculation preferably also involves evaluation of the performance parameter value(s) and/or the relevant performance goal(s) against one or more parameter values, e.g. the corresponding performance parameter value(s), for the current state of the controller 40. In this way the reward value calculation assesses the controller's 40 reaction. Preferably, therefore, reward calculation utilizes knowledge of the current state of the system to describe the reaction of the controller 40. This reaction is based upon the goals that have been set and an understanding of what are deemed to be system failure conditions. The reward variable $r(t+1)$ may therefore be said to comprise a description of the controller's 40 reaction to the system state.

The controller 40 includes a state quantizer 41 for determining which state the, or each, parameter value input corresponds with, and produces an output indicating the determined state. For the purposes of the next action selection, the determined state is designated as the "next state", s(t+1), of the controller 40 since it is the state that resulted from the current action selection. Continuous-data performance state parameters received from the codec 10' (e.g. computational complexity, computational latency, BER and bit burst error rate) are quantized, preferably uniformly quantized, to form an index into the finite state space supported by the controller 40. This index is used to form the next state of the controller 40, s(t+1).

The controller 40 includes a state-action evaluator 48 that maintains a respective evaluation parameter (state-action value) for each state-action supported by the controller 40, where each selectable action for each state constitutes a state-action. In the preferred embodiment, the controller 40 implements a form of Q learning and so the state-action value is the Q value, which may be determined by equation (1). The state-action evaluator 48 updates one or more relevant state-action values depending on the value of the respective reward variable. For a given state, the respective reward value used to update the respective state-action values is calculated using the performance parameter value(s) received from the codec 10' in response to implementing the action(s) previously selected for that state and previously communicated to the codec 10'. In the preferred embodiment, and in accordance with equation (1), the state-action values (Q values) are also updated depending on the corresponding state-action values for the next state s(t+1).

The determined next state s(t+1) is communicated to the logic controller 32 in order that the logic controller 32 knows what the previous state s(t) will be for its next evaluation.

The state-action evaluator 48 communicates the, or each, relevant state-action value (Q value) to the logic controller 42. The logic controller 42 evaluates the received state-action values and selects one using any suitable selection criterion/criteria. The action corresponding to the selected state-action value is the action selected by the controller 40 and communicated to the codec 10'. In the preferred embodiment, it is the last (i.e. previous) state s(t) of the controller 40 and the corresponding state-action values Q(s(t),a(t)) that are used to determine the appropriate action a(t+1) to take. Conveniently, the controller 40 includes an action index 48, the logic controller 42 selecting an action value a(t+1) that identifies a corresponding action from the index 48. The action index 48 may then communicate the identified action to the codec 10'.

In alternative embodiments, the logic controller 42 may be configured to select a state-action (and therefore to select the next action) from a plurality of received corresponding state-action values by applying any desired evaluation method to the state-action values, e.g. simply picking the highest state-action value (or lowest depending on how the state-action values are calculated).

In the preferred embodiment, however, where the logic controller comprises a fuzzy logic controller, the state-action values received by the logic controller 42 are used to construct consequent fuzzy membership functions. The state-action values (which are periodically updated using the reward function) are used to define the ranges of the consequent membership functions, e.g. the centre position, width, height and gradient of the consequent triangles in FIG. 3. The antecedent membership functions for the fuzzy logic controller 42 may be found empirically by experimentation (the values are not important as the controller 40 will adapt). This allows the controller 40 to reward a beneficial outcome such that the associated action is more likely to occur in the future. If the system 10' behaves differently in future then the fuzzy consequent logic will adapt and a more appropriate action will be determined after an initial learning period.

A respective controller 40, or intelligent agent within a single controller, can be provided to control the complexity, computational latency, algorithmic latency and/or error resilience of the codec 10'. Preferably, controllers 40 are utilized in a sequential fashion, with the controller(s) 40 that make critical decisions being applied after those that perform less critical decisions. For example, the controller 40 that monitors the error resilience of the codec 10' is typically implemented last.

Figure 5:
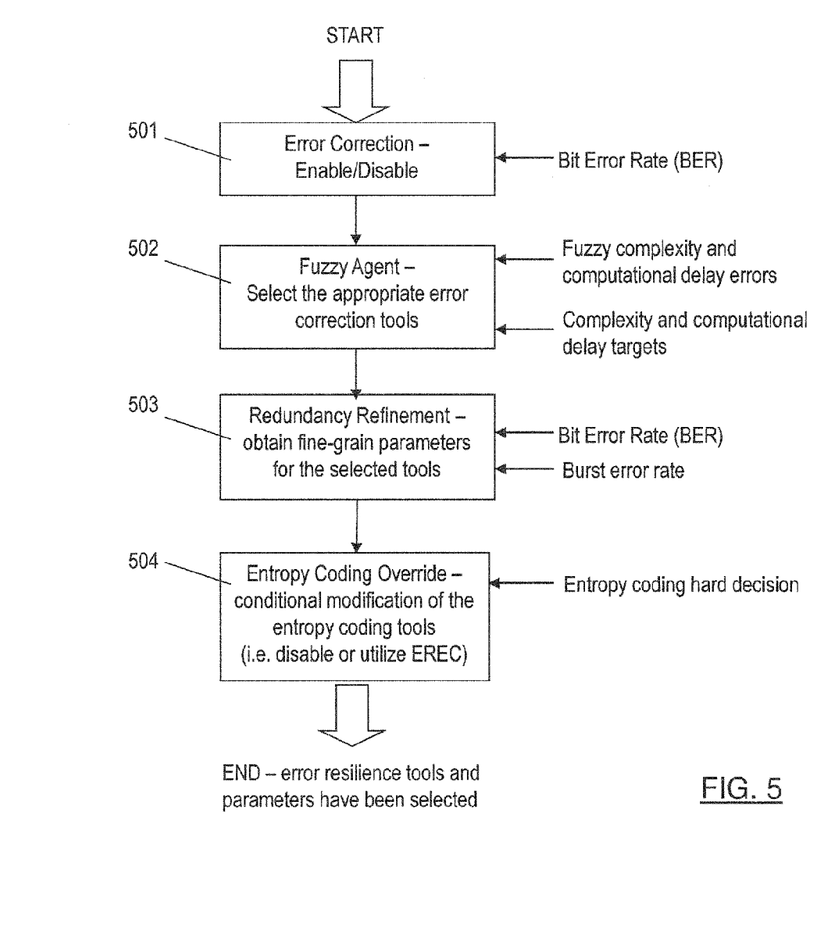
FIG. 5 is a flow chart illustrating a control process for use in achieving error resilience in a multi-dimensional adaptive audio coding algorithm.

FIG. 5 illustrates a control process for use in controlling error resilience in the codec 10'. In this example, the error resilience controller 40 is provided with input performance parameter values for the complexity error, computational latency error, bit error rate (BER) and maximum length of bit burst errors. This controller 40 preferably also has access to decisions taken by preceding controllers 40 in respect of actions that will impact on the performance of error resilience. For example, decisions to utilize Golomb-Rice VLC codes can have a detrimental effect on error resilience and audio quality if the transmission channel suffers from noise. At block 501, the controller 40 determines whether to enable or disable error correction by evaluating the received bit error rate value. At block 502, the controller 40 selects the appropriate error tools using the fuzzy logic/machine learning technique described above based on the received complexity and computational latency error values and respective targets. At block 503, the controller 40 determines one or more settings for the selected coding tool(s) using the received bit error rate and burst error rate. At block 504, may select to override a previous decision made by a previously applied controller 40 (as indicated by the entropy coding hard decision input in FIG. 5).

In the context of error resilience, preferred systems 10 embodying the invention have the ability to cognitively adapt to the presence of bit and packet errors. Advantageously, error control tools can be adapted in a dynamic manner, according to external measures of channel noise and other system parameters.

In preferred embodiments, a fuzzy logic controller is modified to use reinforcement learning to create an intelligent control system. The resulting intelligent agent serves as an adaptive controller for a multidimensional-adaptive audio coding system. With no knowledge of the external system into which it is placed the audio coding system is capable of adapting its structure to achieve a high level of error resilience, whilst maintaining other performance goals such as computational complexity.

Controllers embodying the invention may be implemented in hardware, by computer program(s), or by any combination of hardware and computer program(s), as is convenient.

The invention is not limited to the embodiments described herein, which may be modified or varied without departing from the scope of the invention.

The invention claimed is:

1. A controller for a configurable audio coding system, the controller being arranged to receive from said audio coding system an input comprising at least one performance parameter value indicating at least one performance characteristic of the audio coding system, wherein said controller is configured to maintain a plurality of states, each state corresponding to at least one of said respective performance parameter values and being associated with at least one action for configuring said audio coding system, and wherein said controller comprises
- a reward calculator configured to calculate a reward parameter based on said at least one parameter value and at least one corresponding performance goal,
- a state-action evaluator configured to maintain a respective state-action evaluation value for said at least one action associated with each of said states, and to adjust said respective state-action evaluation value depending on a respective value of said reward parameter,
- an action selector configured to select, for a respective state, at least one of said at least one actions associated with said respective state based on an evaluation of the respective state-action evaluation values of said at least one actions associated with the respective state, and wherein said controller is configured to produce an output comprising data identifying said selected at least one action.

2. The controller as claimed in claim 1, further including a state quantizer configured to determine, from said at least one performance parameter value, a next one of said states to be taken by said controller.

3. The controller as claimed in claim 1, wherein said at least one performance parameter can take a range of values, said controller further including a state quantizer arranged to define a plurality of bands for said values, each band corresponding to a respective one of said states, and wherein said state quantizer is further arranged to determine to which of said bands said at least one performance parameter of said input belongs to.

4. The controller as claimed in claim 3, wherein said state quantizer is configured to determine that the respective state corresponding to said determined band is a next state to be taken by said controller.

5. The controller as claimed in claim 1, wherein said state-action evaluator is configured adjust the respective state-action evaluation values for a respective state depending on a value of said reward parameter calculated using the at least one performance parameter value received in response to configuration of said audio coding system by said selected at least one action for said respective state.

6. The controller as claimed in claim 1, wherein said state-action evaluator is configured adjust the respective state-action evaluation values for a respective state depending on the corresponding state-action evaluation values for a next state to be taken by said controller.

7. The controller as claimed in claim 1, wherein said controller is configured to implement a machine-learning algorithm for maintaining said state-action evaluation values.

8. The controller as claimed in claim 7, wherein said machine learning algorithm comprises a reinforcement machine learning algorithm.

9. The controller as claimed in claim 8, wherein said reinforcement machine learning algorithm comprises a SARSA algorithm.

10. The controller as claimed in claim 1, wherein said at least one performance characteristic includes any one or more of computational complexity, computational latency, bit rate error, bit burst error rate or audio quality.

11. The controller as claimed in claim 1, wherein said at least one action includes selection of at least one coding method or type of coding method for use by said audio coding system.

12. The controller as claimed in claim 1, wherein said at least one action includes selection of a configuration of at least one coding method for use by said audio coding system.

13. The controller as claimed in claim 1, wherein said action selector comprises a fuzzy logic controller.

14. The controller as claimed in claim 13, wherein said fuzzy logic controller uses said respective state-action evaluation values of said at least one actions associated with the respective state to construct consequent fuzzy membership functions.

15. The controller as claimed in claim 1, wherein said at least one of said respective performance parameter values and said at least one action are associated with a respective configurable aspect of the audio coding system.

16. The controller as claimed in claim 15, wherein said configurable aspect comprises a configurable coding tool or coding method.

17. A method of controlling a configurable audio coding system, the method comprising:
- receiving from said audio coding system an input comprising at least one performance parameter value indicating at least one performance characteristic of the audio coding system,
- maintaining a plurality of states, each state corresponding to at least one of said respective performance parameter values and being associated with at least one action for configuring said audio coding system,
- calculating a reward parameter based on said at least one parameter value and at least one corresponding performance goal,
- maintaining a respective state-action evaluation value for said at least one action associated with each of said states,
- adjusting said respective state-action evaluation value depending on a respective value of said reward parameter,
- selecting, for a respective state, at least one of said at least one actions associated with said respective state based on an evaluation of the respective state-action evaluation values of said at least one actions associated with the respective state, and
- producing an output comprising data identifying said selected at least one action.

* * * * *